(12) United States Patent
Hoppe (10) Patent No.: US 7,392,582 B2
(45) Date of Patent: Jul. 1, 2008

(54) SOCKET AND/OR ADAPTER DEVICE, AND AN APPARATUS AND PROCESS FOR LOADING A SOCKET AND/OR ADAPTER DEVICE WITH A CORRESPONDING SEMI-CONDUCTOR COMPONENT

(75) Inventor: Holger Hoppe, Mering (DE)

(73) Assignee: Infineon Technologies AG, Munich (DE)

( * ) Notice: Subject to any disclaimer, the term of this patent is extended or adjusted under 35 U.S.C. 154(b) by 341 days.

(21) Appl. No.: 11/008,648

(22) Filed: Dec. 10, 2004

(65) Prior Publication Data

US 2005/0125994 A1 Jun. 16, 2005

(30) Foreign Application Priority Data

Dec. 15, 2003 (DE) ................................ 103 58 691

(51) Int. Cl.
*B23P 19/00* (2006.01)
(52) U.S. Cl. .............................. 29/739; 29/740; 29/741; 29/743; 29/758; 29/759
(58) Field of Classification Search .................... 29/739, 29/741, 743, 758, 759
See application file for complete search history.

(56) References Cited

U.S. PATENT DOCUMENTS

| 4,744,768 | A | 5/1988 | Rios |
| 4,747,784 | A | 5/1988 | Cedrone |
| RE33,466 | E | 12/1990 | Kato |
| 5,314,223 | A | 5/1994 | Harper, Jr. et al. |
| 6,279,225 | B1 | 8/2001 | Martin et al. |
| 6,402,528 | B2 | 6/2002 | Takahashi et al. |
| 6,462,534 | B2 | 10/2002 | Kang et al. |

FOREIGN PATENT DOCUMENTS

| DE | 3620944 C2 | 9/1995 |
| DE | 19580944 T1 | 1/1998 |
| DE | 19743211 C2 | 6/1998 |

*Primary Examiner*—C. J Arbes
(74) *Attorney, Agent, or Firm*—Slater & Matsil, L.L.P.

(57) ABSTRACT

The invention refers to a process for loading a socket and/or adapter device with a corresponding semi-conductor component, a socket and/or adapter device, a precision alignment device, as well as a mechanism for loading a socket and/or adapter device with a corresponding semi-conductor component, whereby the mechanism comprises a device, especially a mechanical device for aligning the mechanism in relation to the socket and/or adapter device.

21 Claims, 4 Drawing Sheets

SOCKET AND/OR ADAPTER DEVICE, AND AN APPARATUS AND PROCESS FOR LOADING A SOCKET AND/OR ADAPTER DEVICE WITH A CORRESPONDING SEMI-CONDUCTOR COMPONENT

CLAIM FOR PRIORITY

This application claims the benefit of priority to German Application No. 103 58 691.1, which was filed in the German language on Dec. 15, 2003, the contents of which are hereby incorporated by reference.

TECHNICAL FIELD OF THE INVENTION

The invention involves a socket and/or adapter device, especially for a semi-conductor component, and an apparatus and a process for loading a socket and/or adapter device with a corresponding semi-conductor component, and a precision alignment device to be used in a procedure of this nature.

BACKGROUND OF THE INVENTION

Semi-conductor components, for instance corresponding integrated (analog and/or digital) computer circuits, semi-conductor memory components, for instance functional memory components (PLAs, PALS, etc.) and table memory components (e.g. ROMs or RAMs, in particular SRAMs and DRAMS) are subjected to extensive testing during the manufacturing process.

For the simultaneous, combined manufacture of numerous (generally identical) semi-conductor components, a so-called wafer (i.e. a thin disk of monocrystalline silicon) is used.

The wafer is appropriately treated (for instance subjected in succession to numerous coating, exposure, etching, diffusion and implantation process steps, etc.), and then for instance sliced up (or scored and snapped off), so that the individual 30 components become available.

After the wafers have been sliced up (and/or scored and snapped off) the—individually available components—are each separately loaded into special housings or packages (for instance, so-called TSOP or FBGA housings etc.) and then—by means of appropriate trays—transported to a corresponding further station, especially a test station (and/or in succession to several different test stations).

The above test station may for instance be a so-called burn-in testing station (at which, by creating extreme conditions a so-called burn-in test procedure is performed, i.e. a test done under extreme conditions (for instance increased temperature, for instance above 80° C. or 100° C., increased operational voltage, etc.)).

Loading the (burn-in) adapter and/or socket with a component to be tested can be done with the help of one or several appropriate loading apparatuses ("loaders").

For doing this, a grabber device, provided at an appropriate loading apparatus (loader), can for instance create a partial vacuum at a loader head, with the help of which a component can be removed from a tray and then—by means of an appropriate (for instance a swiveling or shifting) motion of the grabber device and/or the "loader head"—positioned above a so-called precision alignment device.

Then the component positioned above the precision alignment device can be dropped by the loader of the grabber device—by reducing the vacuum—into one of the recesses provided with appropriate tapered guiding surfaces on the precision alignment device.

By means of the tapered guiding surfaces it can be achieved that the component and/or component housing is (pre- or approximately) aligned by being dropped into the corresponding precision alignment recess.

Next the component can again be removed by the above loading apparatus (and/or by any additional loading apparatus) from the recess provided in the precision alignment device (for instance by creating a partial vacuum at the grabber device (and/or the loader head) provided at the above or at any additional loading apparatus.

Next the component can be positioned above a corresponding (burn-in) adapter and/or socket by means of an appropriate (for instance a swiveling or shifting) motion of the grabber device and/or the loader head.

Conventional (burn-in) adapters and/or sockets may for instance include a base element and a cover, which is adjustable in a vertical direction in relation to the base element by means of corresponding spring sections attached to the base element.

By appropriate downward pressure on the adapter and/or socket cover, the adapter and/or socket can be "opened", whereafter the component suspended above the adapter and/or socket by the grabber device of the loader can be dropped into the adapter and/or socket by reducing the vacuum.

Appropriate tapered guiding surfaces can be provided inside the adapter and/or socket, for the purpose of—exactly—aligning the component and/or the component housing when it falls into the adapter.

When the adapter and/or the socket cover is then released, it is again forced upwards by the above-mentioned spring sections, whereby it is achieved that connections provided on the corresponding component (and/or component housing) make contact with connections provided on the corresponding adapter and/or socket, such that the adapter and/or socket is "closed" so that the above test procedure can then be performed on the component.

SUMMARY OF THE INVENTION

The invention discloses a novel socket and/or adapter device, in particular one to be used for semi-conductor components, as well as a novel apparatus and a novel process for loading a socket and/or adapter device with a corresponding semi-conductor component, and a precision alignment device to be used in a corresponding process, especially an apparatus and a process with which the loading of a socket and/or adapter device with a corresponding semi-conductor component can be done in a less costly way than with conventional technology.

In one embodiment of the invention, an apparatus, especially a loader head, is provided for loading a socket and/or adapter device with a corresponding semi-conductor component, whereby the apparatus comprises a device, in particular a mechanical device, for aligning the apparatus in relation to the socket and/or adapter device.

Advantageously, in order to align the apparatus in relation to the socket and/or adapter device, a device, in particular a (further) mechanical device—working in conjunction with the alignment device provided at the apparatus—is provided at the socket and/or adapter device.

In a particularly advantageous embodiment of the invention, the alignment device provided at the apparatus is additionally used for the alignment of the apparatus in relation to a precision alignment device.

BRIEF DESCRIPTION OF THE DRAWINGS

The invention is described in more detail below with reference to the exemplary embodiments illustrated in the figures, in which.

DETAILED DESCRIPTION OF THE INVENTION

Figure 1:
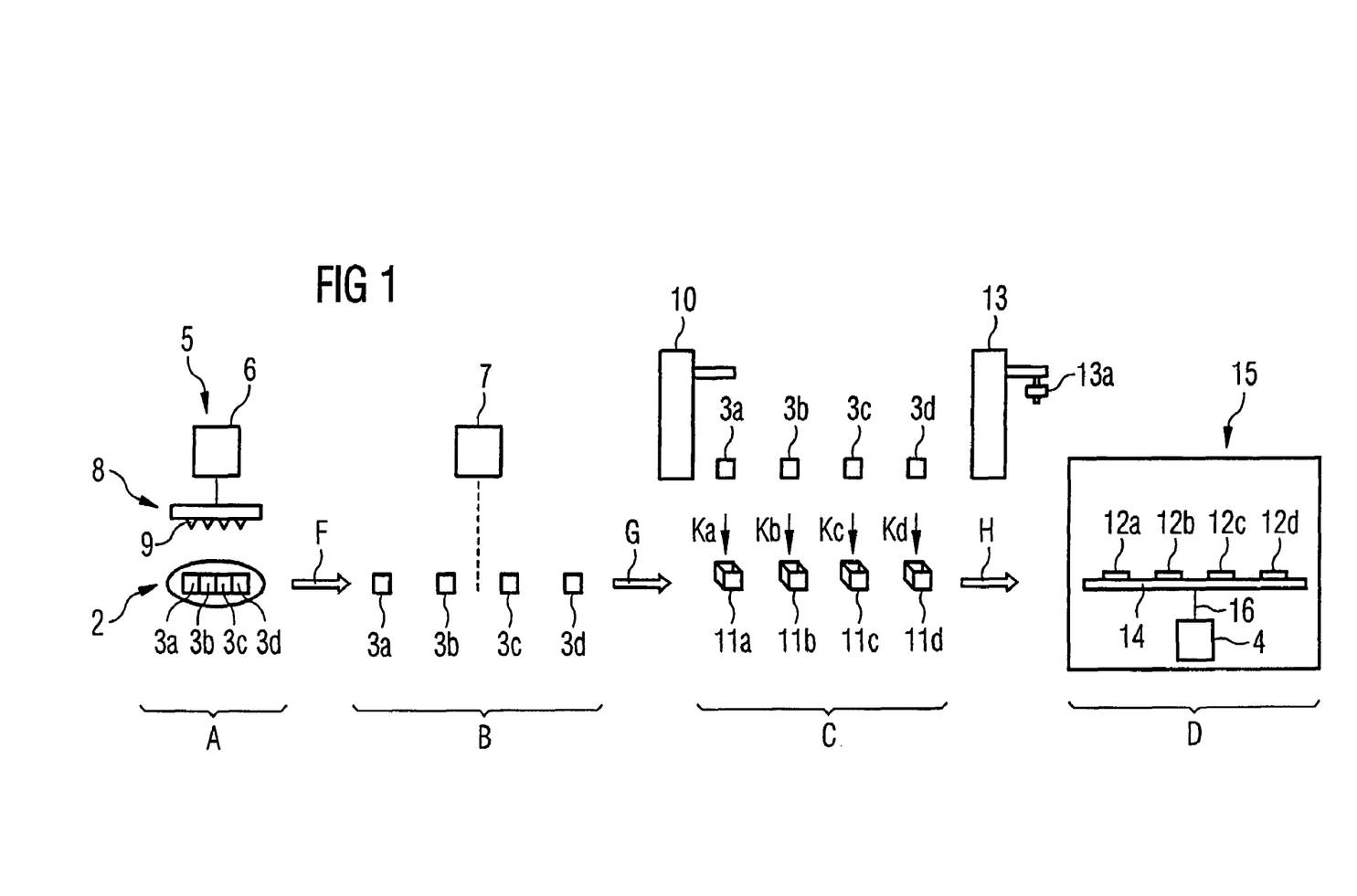
FIG. 1 shows various stations passed through during the manufacture of corresponding semi-conductor components.

In FIG. 1, some stations A, B, C, D (of several further stations not shown here) passed through by the corresponding semi-conductor components 3a, 3b, 3c, 3d during the manufacture of the semi-conductor components 3a, 3b, 3c, 3d are—schematically—represented.

Station A serves to subject the semi-conductor components 3a, 3b, 3c, 3d—still present on a silicon disc or wafer 2—to one or more test procedures (for instance by means of an appropriate test system 5—for instance including a test 30 apparatus 6 and a semi-conductor component test card 8 and/or probe card 8 (which has been provided with contact pins 9 for contacting corresponding contacts on the semi-conductor components 3a, 3b, 3c, 3d)).

At stations not shown here and upstream from the stations A, B, C, D shown in FIG. 1, the wafer 2 has been subjected to corresponding conventional coating, exposure, etching, diffusion and implantation process steps etc.

The semi-conductor components 3a, 3b, 3c, 3d may for instance be corresponding integrated (analog and/or digital) computer circuits, or semi-conductor memory components, for instance functional memory components (i.e. PLAs, PALs, etc.), and table memory components, (for instance ROMs or RAMS), in particular SRAMs or DRAMs (here for instance DRAMs (Dynamic Random Access Memories and/or Dynamic Read-Write Memories) with double data rate (DDR DRAMs=Double Data Rate-DRAMS), preferably high-speed DDR DRAMs).

When the test procedure has been successfully completed at the above station A, wafer 2 is (fully automatically) transported to the next station B (see arrow F), where (after wafer 2 has had foil glued to it in a recognized fashion) it is sliced up by means of an appropriate machine 7 (or for instance scored and snapped off), so that the individual semi-conductor components 3a, 3b, 3c, 3d become available.

After wafer 2 has been sliced up at station B, the components 3a, 3b, 3c, 3d are then (again fully automatically—for instance by means of an appropriate conveyer machine—) transported to the next test station (here a loading station C)—for instance directly (and/or individually) or alternatively for instance by means of a corresponding 30 tray)(see arrow G).

At the loading station C the components 3a, 3b, 3c, 3d are—individually—loaded in fully automatic fashion into corresponding housings 11a, 11b, 11c, 11d and/or packages (see arrows $K_a$, $K_b$, $K_c$, $K_d$), with the help of an appropriate machine (loading machine) and the housings 11a, 11b, 11c, 11d are then closed—in recognized fashion—so that the semi-conductor component contacts provided on the semi-conductor components 3a, 3b, 3c, 3d make contact with corresponding housing contacts provided at each housing 11a, 11b, 11c, 11d.

Conventional TSOP housings or for instance conventional. FBGA housings, etc. may be used for the housings 11a, 11b, 11c, 11d.

Next, the housings 11a, 11b, 11c, 11d—together with the semi-conductor components 3a, 3b, 3c, 3d—again fully automatically—for instance by means of a corresponding conveyer, and where appropriate by using a corresponding, tray 17 (for instance one shown in FIG. 2) are conveyed to a further station D, for instance a testing station (cf. arrow H), and/or in succession to several further stations, especially testing stations (not shown here).

Station D (or one or several of the above further stations, not shown here) may for instance be a so-called burn-in station, especially a burn-in testing station.

At the burn-in station artificial aging of the components 3a, 3b, 3c, 3d is caused by extreme conditions (for instance increased temperatures) being generated.

Additionally, one or several burn-in test procedures can be performed at the burn-in station, i.e. tests done under extreme conditions (for instance increased temperatures, for instance above 80° C. or 100° C., and/or increased operating voltages, etc.).

At station D the housings 11a, 11b, 11c, 11d—as is more closely described below—are loaded with the help of one or several appropriate machines-(for instance a loading machine 13, "loader") (and where appropriate, a further, loading machine (a "loader", not shown here)) into corresponding (burn-in) sockets and/or (burn-in) adapters 12a, 12b, 12c, 12d. The loading machine 13 (and correspondingly also the further loading machine, where provided) has—as shown in FIGS. 1 and 2—a grabber device 13a and/or a loader head 13a.

Figure 2:
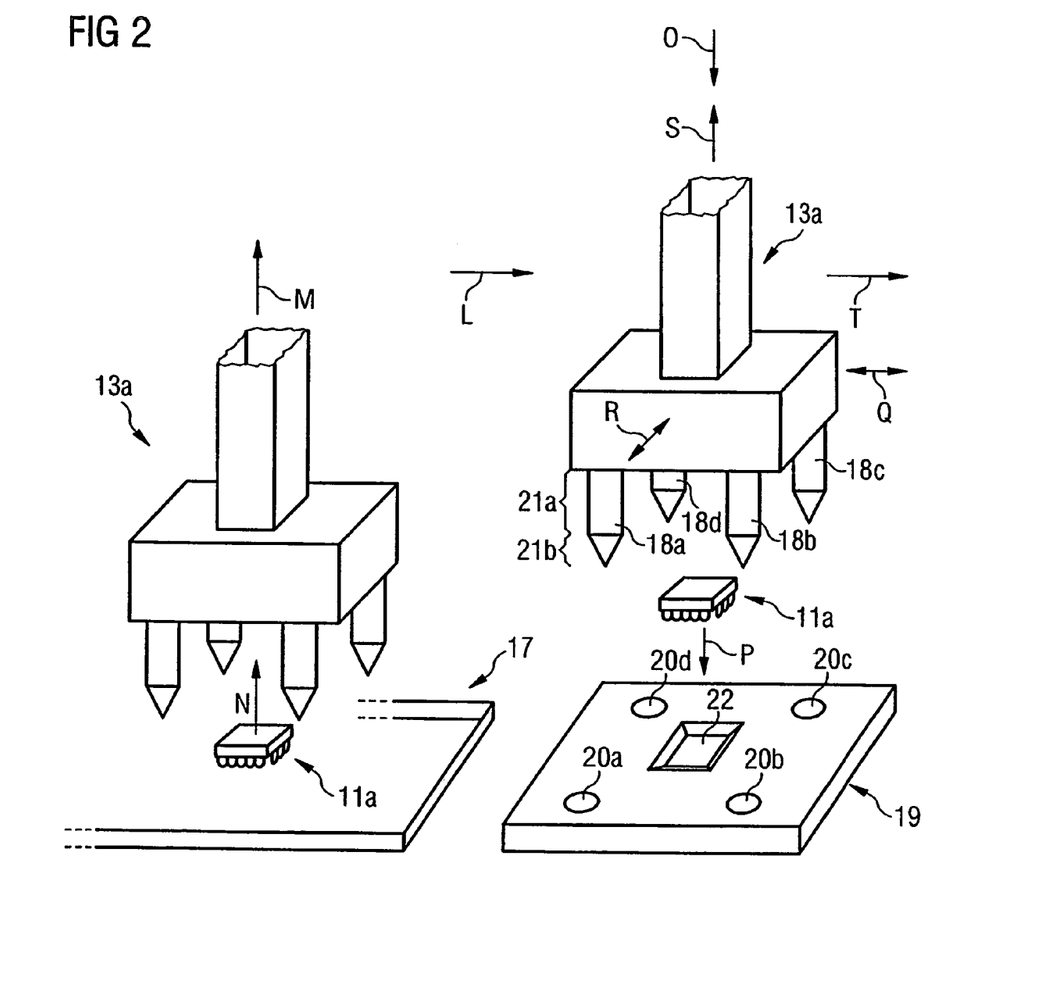
FIG. 2 shows a grabber device of the loading machine used in the "burn-in" test system shown in FIG. 1, and a precision alignment device.

To load a (burn-in) socket and/or (burn-in) adapter 12a with a corresponding component 3a and/or component-housing 11a, the grabber device 13a is first positioned—for instance as shown in FIG. 2—directly above the corresponding tray 17 (and/or more accurately: directly above the corresponding component 3a and/or component housings 11a)—correspondingly similar to conventional loading machines—whereupon a suitable vacuum is created at the grabber device 13a and/or the loader head 13a (and/or more accurately: below the grabber device 13a and/or the loader head 13a).

Figure 3:
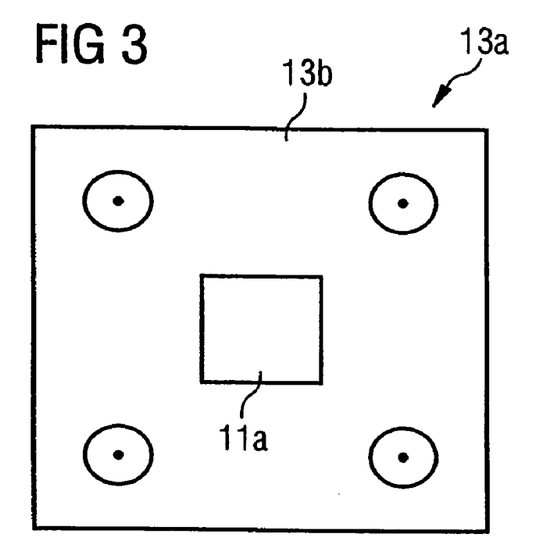
FIG. 3 shows the grabber device shown in FIG. 2 from below.

In this way the component 3a—arranged in a corresponding housing 11a and lying on tray 17 (similarly constructed to conventional trays) is moved upwards in the direction of arrow N—as shown in FIG. 3—and firmly held by the underside 13b of the grabber device 13a (essentially in the middle of several centering devices 18a, 18b, 18c, 18d, more accurately described below) i.e. the component 3a is removed from tray 17.

Next—while the vacuum is maintained—the grabber device 13a, together with the component 3a and/or component housing 11a held at the underside 13b of the grabber device 13a, is positioned above the precision alignment device 19—shown to the right in FIG. 2—(more accurately: above a corresponding centering recess 22 of the precision device 19)—by means of an appropriate movement (for instance swiveling or sliding) of the grabber device 13a and/or the loader head 13a (for instance first upwards in the direction of the arrow M shown in FIG. 2, and then laterally in the direction of the arrow L shown in FIG. 2, etc.).

Figure 4:
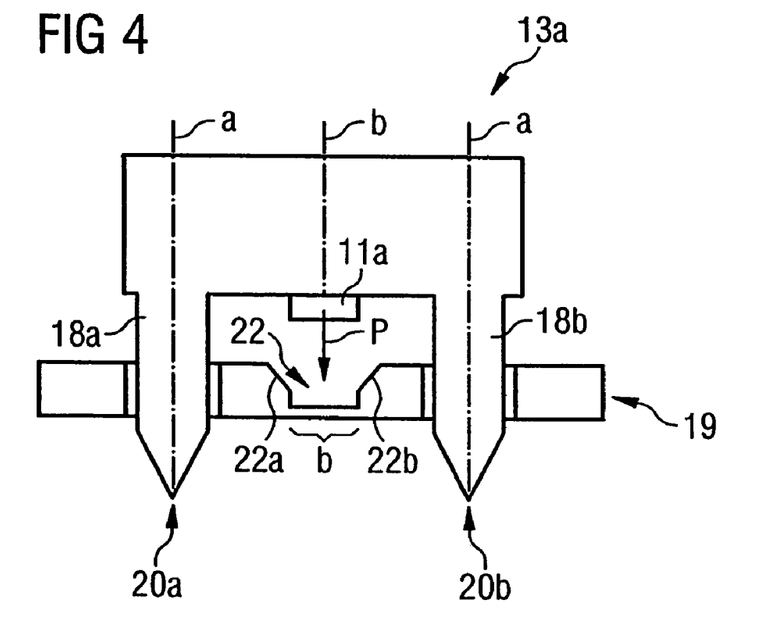
FIG. 4 shows a sectional view of the grabber device shown in FIGS. 2 and 3, and the precision alignment device alignment shown in FIG. 2.

The precision alignment device 19 is similarly constructed to conventional precision alignment devices, yet has been provided—as shown in FIG. 2 and FIG. 4—with several centering holes 20a, 20b, 20c, 20d on the underside 13b of the grabber device 13a for receiving the above centering devices 18a, 18b, 18c, 18d.

The centering holes 20a, 20b, 20c, 20d are essentially circular in section—with an essentially constant inside diameter—and reach partially or completely downwards through the whole precision alignment device 19 in a vertical direction from the upper side of the precision alignment device 19.

As shown in FIGS. 2 and 4, the centering devices 18a, 18b, 18c, 18d provided on the grabber device 13a reach vertically downwards from the underside of the grabber device. Each of the centering devices 18a, 18b, 18c, 18d (here: four, alternatively for instance two or three, etc.) has—as is for instance apparent from FIG. 3 when seen from below—an essentially circular cross section.

Each of the centering devices 18a, 18b, 18c, 18d has (as is for instance apparent from FIG. 2 and FIG. 4) an upper section 21a, which is essentially cylindrical and, connected to the upper section 21a, a lower section 21b, which is essentially tapered downwards into a conical shape.

As shown in FIG. 4, the vertical axes of the centering devices 18a, 18b, 18c, 18d, running centrally through the conical sections of the centering devices 18a, 18b, 18c, 18d, 35 are in exact alignment with the central vertical axes of the corresponding centering openings 20a, 20b, 20c, 20d of the precision alignment device 19, when correspondingly aligned by the grabber device 13a.

The inside diameter of each centering opening 20a, 20b, 20c, 20d is essentially identical to the maximum outside diameter of the corresponding conical sections 21b of each centering device 18a, 18b, 18c, 18d (at the top end of the corresponding conical sections 21b), i.e. the outside diameter of the corresponding cylindrical sections 21a of each of the centering devices 18a, 18b, 18c, 18d, and/or is somewhat smaller.

The grabber device 13a and/or the loader head 13a is supported on a "floating" bearing in relation to the other parts of the loading machine 13.

When the grabber device 13a is moved vertically downwards, away from the position shown in FIG. 2, at the top right-hand side in the direction of the arrow O—to a position above the precision alignment device 19 (and/or above the centering recess 22 of the precision alignment device 19)—for instance to the position shown in FIG. 4 (or even further downwards), the centering devices 18a, 18b, 18b, 18c (and/or their conical sections 21b) provided on the grabber device 13a, are introduced into each corresponding centering opening 20a, 20b, 20c, 20d of the precision alignment device 19.

Due to the above-mentioned "floating" bearing of the grabber device 13a (i.e. due to its lateral flexibility) the grabber device 13a—not yet accurately centered and/or aligned above the precision alignment device 19 and/or its centering-recess 22—is centered and/or aligned (i.e. moved slightly laterally as shown by the arrows Q and R in FIG. 2), so that once the centering devices 18a, 18b, 18b, 18c have been inserted into each of the corresponding centering openings 20a, 20b, 20c, 20d, the central axes a of the centering devices 18a, 18b, 18b, 18c exactly coincide with the corresponding central axes a of the centering openings 20a, 20b, 20c, 20d of the precision alignment device 19.

The component 3a and/or component-housing 11a—suspended above the precision alignment device 19 and/or its centering recess 22—is made to drop into the centering recess 22 (cf. for instance arrow P in FIGS. 2 and 4) by releasing the vacuum at the grabber device 13a.

The centering recess has—as is for instance shown in FIG. 4—corresponding tapered sides 22a, 22b.

The tapered sides 22a, 22b run at an angle downwards and inwards from the inside edges of the centering recess 22 on the upper side of the precision alignment device 19.

At some lower point inside the centering recess 22 the dimensions of the centering-recess 22 essentially correspond with the dimensions of component 3a and/or component housings 11a (for instance the width—as shown in FIG. 4—of the centering-recess 22 in the above-mentioned lower point essentially corresponds with the width of component 3a and/or the component-housings 11a, and the length of the centering recess 22 essentially corresponds with the length of the components 3a and/or component-housings 11a).

By means of the tapered guiding edges 22a, 22b it can be achieved that component 3a and/or the component housing 11a—and thereby also the grabber device 13a—are appropriately aligned and/or centered in relation to the precision alignment device 19 (i.e. moved slightly in a lateral direction when falling into the centering recess 22, so that when, after falling into the centering recess 22, the central axis a of the component 3a and/or component housing 11a coincides exactly with the central axis b of the centering recess 22).

Next, the grabber device 13a of the above loading machine 13 (or for instance a corresponding grabber device of an additional loading machine such as the one mentioned above—if provided—) for instance at the setting of the grabber device 13a shown in FIG. 4, or after the grabber device 13a has been moved even further downwards—can again remove the component 3a and/or component-housing 11a from the centering recess 22 provided in the precision alignment device 19 (for instance by (again) creating a vacuum at the grabber device 13a and/or the loader head 13a (and/or more accurately: underneath the grabber device 13a and/or the loader head 13a).

Hereby the component 3a and/or component-housing 11a, inserted in the centering recess 22, are pulled upwards against the direction of the arrow P shown in FIGS. 2 and 4, and—as shown in FIG. 3—again held at the underside 13b of the grabber device 13a (by now—due to the centering of the component 3a in relation to the precision alignment device 19, and the centering of the grabber device 13a in relation to the precision alignment device 19—exactly in the middle between the above-mentioned centering devices 18a, 18b, 18c, 18d, i.e. in a way that exactly centers it in relation to the grabber device 13a).

Figure 5:
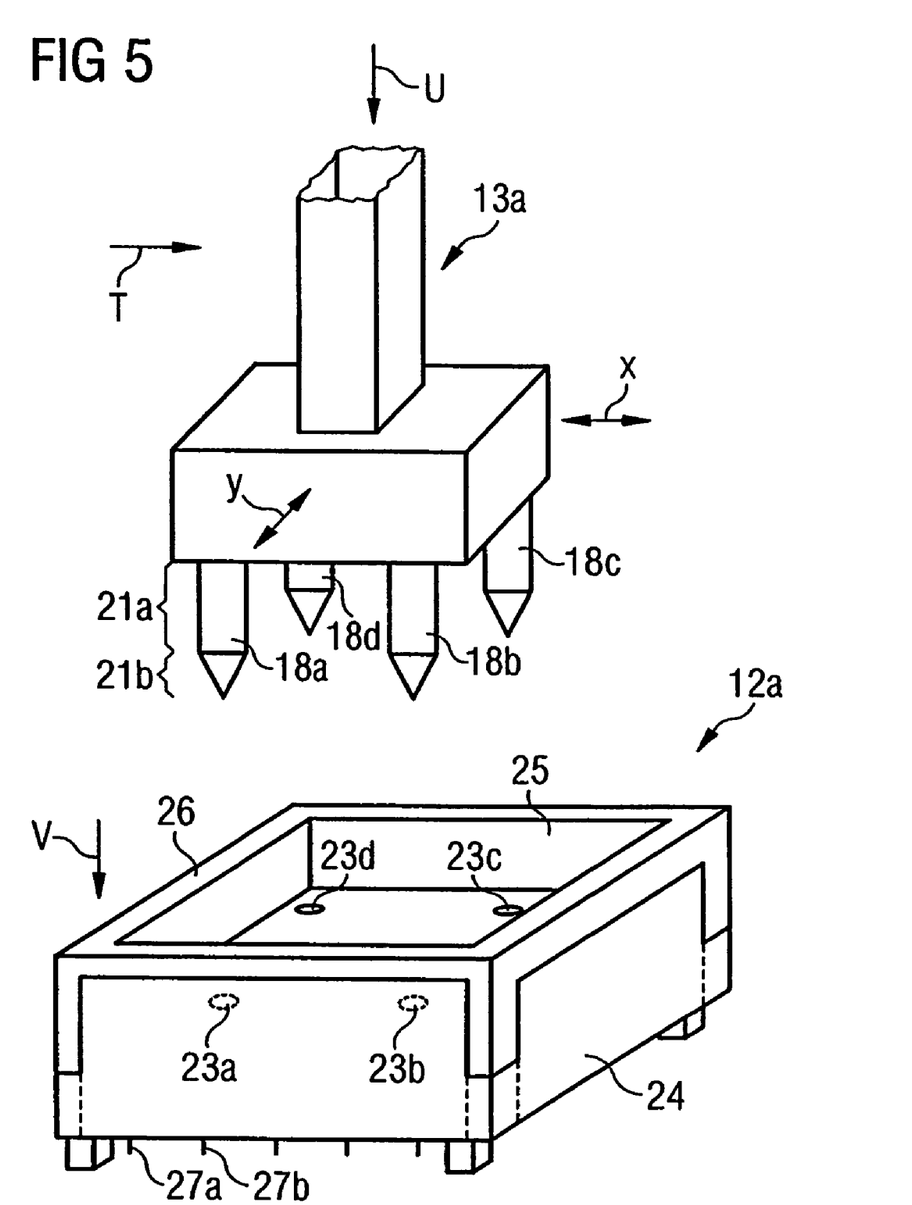
FIG. 5 shows the grabber device, and an adapter and/or socket.

Next—by appropriately moving (for instance by swiveling and/or shifting) the grabber device 13a and/or the loader 30 head 13a (for instance initially upwards in the direction of the arrow S shown in FIG. 2, and then laterally in the direction of the arrow T shown in FIG. 2 and FIG. 5, etc.) the grabber device 13a is for instance held—while the vacuum is maintained—together with the centered and/or aligned component 3a and/or component-housing 11a at the underside 13b of the grabber device 13a—in position above a corresponding (burn-in) socket and/or (burn-in) adapter 12a, 12b, 12c, 12d (cf. FIG. 5).

The socket and/or adapter 12a, 12b, 12c, 12d may be constructed essentially similarly to conventional "burn-in" sockets and/or "burn-in" adapters (for instance corresponding TSOP- or FBGA "burn-in" sockets), except that they—in contrast to conventional sockets and/or adapters, and correspondingly similar to the precision alignment device 19 shown in FIGS. 2 and 4—have several centering openings 23a, 23b, 23c, 23d and—again in contrast to conventional sockets and/or adapters—have no tapered surfaces and/or other "guidance" devices.

As is clear from FIG. 5, the (burn-in) adapter and/or socket 12a, 12b, 12c, 12d each has a—bottom—base element 24, and a cover 25, which is moveable in relation to the base element 24, for instance in a vertical direction, due to being attached by means of a moveable bearing to the base element 24 with spring elements in between.

By means of appropriate downwards pressure on the adapter—and/or the socket cover and/or cover 25 (in the direction of the arrows shown in FIG. 5) the adapters and/or sockets 12a, 12b, 12c, 12d—correspondingly similar to conventional adapters and/or sockets can be opened and—as is more accurately described below—after the adapter and/or socket cover 25 has been released, can again be closed.

The centering openings 23a, 23b, 23c, 23d have—correspondingly similar to the centering openings 20a, 20b, 20c, 20d provided at the precision alignment device 19—an essentially circular cross-section, and run vertically downwards—with an essentially constant inside diameter—from the upper side of the base element 24 of the socket and/or adapter—passing partially or wholly through the entire base element 24.

As is clear from FIG. 5, the central vertical axes a of the centering devices 18a, each passing through the middle of the conical sections 21a of the centering devices 18a, 18b, 18c, 18d, 18b, 18c, 18d—when the grabber device 13a is appropriately aligned—coincide exactly with the corresponding central axes running vertically through the corresponding centering openings 23a, 23b, 23c, 23d of the 10 adapter and/or socket 12a.

The inside diameter of each centering opening 23a, 23b, 23c, 23d coincides—just as is the case with the corresponding centering openings 20a, 20b, 20c, 20d of the precision alignment device 19—essentially with the maximum dimension of the outside diameter of the conical sections 21b provided on each centering device 18a, 18b, 18c, 18d (at the top end of the corresponding conical sections 21b), i.e. with the outside diameter of the corresponding cylindrical sections 21a of each centering device 18a, 18b, 18c, 18d.

As already described above, the grabber device 13a and/or the loader head 13a are attached by means of a "floating" bearing in relation to the other parts of the machine 13.

When the grabber device 13a is moved vertically downwards from the setting shown in FIG. 3 above the adapter and/or socket 12a—in the direction of the arrow U—the centering devices 18a, 18b, 18b, 18c, provided at the bottom of the grabber device 13a, are inserted into each centering opening 23a, 23b, 23c, 23d of the precision alignment device 19.

As a result of the above-mentioned "floating" attachment of the grabber device 13a (i.e. its ability to move laterally) the grabber device 13a—not yet exactly centered and/or aligned—is centered and/or aligned in relation to the adapter and/or socket 12a as shown in FIG. 5 by the arrows X and Y—e.g. moved laterally to a certain extent, so that once the centering devices 18a, 18b, 18b, 18c have been inserted into the centering openings 23a, 23b, 23c, 23d provided in each case, the central axes a of the centering devices 18a, 18b, 18b, 18c coincide exactly with the corresponding central axes of the centering openings 23a, 23b, 23c, 23d of the socket and/or adapter 12a.

The grabber device 13a is moved vertically downwards so far from the setting shown in FIG. 3 above the adapter and/or socket 12a in the direction of the arrow U—that the essentially flat underside 13b of the grabber device 13a presses down from the top against the upper edge 26 of the cover 25, which is then correspondingly forced downwards in the direction of the arrow V shown in FIG. 5 so that the socket and/or adapter 12a is opened.

Thereby the grabber device 13a is forced down so far (arrow U), that the component 3a and/or component-housing 11a—held by the vacuum being maintained—touches the top of the base element 24 at the underside 13b of the grabber device 13a below; then is the vacuum released and the component 3a and/or component-housing 11a released.

In other words, the component 3a and/or component-housing 11a is gently placed into the adapter and/or socket 12a, and not—as with conventional grabber devices—aligned with the help of corresponding tapered guide surfaces provided at the sockets and/or adapter and dropped into the adapter and/or socket.

This placing action is possible because the component 3a and/or the component-housing 11a has already been relatively accurately aligned in relation to the grabber device 13a by means of the process described above (i.e. by the precision alignment device 19), and by inserting the centering devices 18a, 18b, 18c, 18d of the grabber device 13a into the centering openings 23a, 23b, 23c, 23d—provided at the socket and/or adapter 12a—the grabber device 13a is additionally also aligned with relatively high accuracy in relation to the socket and/or adapter 12a.

Next the grabber device 13a is retracted—vertically—upwards, which again releases the cover 25 of the adapter and/or socket 12a, i.e. by being forced upwards by the abovementioned spring elements, which causes the connections provided at each component 3a (and/or component-housing 11a) to make contact with corresponding connections provided at the adapter and/or socket 12a, i.e. the adapter and/or socket 12a is "locked".

In similar fashion the grabber device 13a (or—it being the case—the above further grabber device) can load a multitude of further adapters and/or sockets 12b, 12c, 12d, and/or the component-housings 11b, 11c, 11d etc.—similarly constructed to the socket and/or adapter 12a shown in FIG. 5—with corresponding components 3b, 3c, 3d, etc. (for instance at a rate of more than 100 or 1,000 adapters and/or sockets per hour).

In each case, several of these sockets and/or adapters 12a, 12b, 12c, 12d (for instance more than 50, 100 or 200 sockets and/or adapters 12a, 12b, 12c, 12d) have been connected—as can be seen in FIG. 1—to one and the same card 14 and/or board 14 at testing station D (and/or to one and the same test card and/or test board 14).

The test-board 14 (and thereby also the semi-conductor components 3a, 3b, 3c, 3d and/or housing 11a, 11b, 11c, 11d loaded into the sockets and/or adapters 12a, 12b, 12c, 12d) are loaded—as shown in FIG. 1—with the help of an appropriate machine into an "oven" a5 that can be shut (and/or into an apparatus 15, with which extreme conditions can be created for the above semi-conductor components 3a, 3b, 3c, 3d (for instance increased temperatures, for instance above 70° C., 100° C., or 150° C., and/or increased component operating voltages, etc.)).

The test-card 14 and/or the test board 14 is in each case—in the conventional manner, connected to a test apparatus 4, for instance by means of a corresponding line 16.

This causes the test signals being generated by the test apparatus 4 to be relayed, for instance by means of the above line 16, to the test card 14, and from there to the sockets 12a, 12b, 12c, 12d, and their socket contact pins 27a by means of the corresponding card contacts 27b.

From the sockets 12a, 12b, 12c, 12d the corresponding test signals are then relayed via the above socket connections and their closed housing connections to the housings 11a, 11b, 11c, 11d, and from there via the above housing contacts, and their closed semi-conductor component contacts, to the semi-conductor components 3a, 3b, 3c, 3d to be tested.

The signals emitted in reaction to the test signals being applied to corresponding semi-conductor component contacts are then scanned by corresponding housing contacts (in contact with them) and led to the sockets 12a, 12b, 12c, 12d, the card 14 and via the line 16 to the test apparatus 4, where the corresponding signals can then be evaluated.

Thereby the test system 1—which includes inter alia the test apparatus 4, the card 14 and the sockets 12a, 12b, 12c, 12d—can perform a corresponding conventional test procedure—for instance a conventional "burn-in" test (or several similar tests in succession), in which and/or in the course of which for instance the functionality of the semi-conductor components 3a, 3b, 3c, 3d can be evaluated (for instance while or after the semi-conductor components are being or have been subjected to the above-mentioned extreme conditions in the above "oven" 15 or the apparatus 15 for a relatively long period of time (for instance for more than 30 minutes, and/or more than 1 hour)).

The invention claimed is:

1. A system for loading a semi-conductor component into a socket, the system comprising:
   a socket comprising a moveable cover;
   a semi-conductor component disposed on a tray and directly underneath a loading machine, the loading machine comprising a device for aligning the loading machine in relation to the socket, wherein the loading machine comprises a mechanism for opening the moveable cover while loading the semi-conductor component onto the socket; and
   a precision alignment device comprising a recess and aligning features, wherein the recess positions the semi-conductor component on the loading machine when a bottom surface of the loading machine contacts a top surface of the precision alignment device, wherein the semi-conductor component is positioned on the loading machine by lowering the bottom surface of the loading machine to contact the top surface of the precision alignment device and releasing the vacuum on the bottom surface of the loading machine, and wherein the precision alignment device, the socket and the tray are separate and distinct units.

2. The system according to claim 1, wherein the device for aligning the loading machine comprises an attachment provided on the loading machine, the attachment comprising a corresponding tapered section.

3. The system according to claim 2, wherein the attachment comprises a conical section.

4. The system according to claim 1, wherein the device for aligning the loading machine comprises a recess provided at the loading machine.

5. The system according to claim 1, wherein the socket comprises an aligning feature, wherein the device for aligning the loading machine couples with the aligning feature, and wherein the socket comprises no additional tapered surfaces or guidance devices.

6. The system according to claim 1, wherein the device for aligning the loading machine couples with the aligning features on the precision alignment device.

7. The system according to claim 1, wherein the loading machine comprises a loader head supported by a floating bearing.

8. The system according to claim 7, wherein the floating bearing allows free lateral motion of the loader head.

9. The system according to claim 7, wherein the floating bearing allows the loader head to move freely in a lateral direction as the loader head approaches the socket, or as the loader head approaches the precision alignment device.

10. The system according to claim 1, wherein:
    the socket comprises a first aligning feature, wherein the device for aligning the loading machine couples with the first aligning feature; and
    the precision alignment device comprises a second aligning feature, wherein the device for aligning the loading machine couples with the second aligning feature.

11. The system according to claim 10, wherein the device for aligning the loading machine comprises a pin, and wherein the first and second aligning features comprise a hole.

12. The system according to claim 11, wherein the pin comprises a conical tip.

13. The system according to claim 12, wherein the loading machine comprises a loader head supported on a floating bearing, wherein the floating bearing allows for lateral motion of the loader head.

14. The system according to claim 13, wherein the conical tip entering the hole guides a lateral position of the loading machine as the loader head approaches the socket or the precision alignment device.

15. The system according to claim 1, wherein the loading machine automatically opens the moveable cover while loading the semi-conductor component into the socket.

16. A loading device comprising:
    an alignment device for aligning an electronic component to a loader head, the loader head comprising a plurality of pins, and the alignment device comprising a first set of plurality of holes, wherein the electronic component becomes aligned with the loader head in relation to a corresponding position in a socket when the plurality of pins are disposed inside the first set of plurality of holes; and
    a socket comprising a moveable cover; the socket further comprising a second set of plurality of holes and no additional tapered surfaces or guidance devices, and wherein the socket loads the electronic component correctly when the plurality of pins are disposed inside the second set of plurality of holes, and wherein the first set of plurality of holes and the second set of plurality of holes are identical.

17. The loading device according to claim 16, wherein the alignment device comprises a recess disposed on a planar surface, wherein the recess positions the electronic component.

18. The loading device according to claim 17, wherein the the plurality of pins comprise a tapered tip.

19. The loading device according to claim 17, wherein the recess comprises edges which correspond to dimensions of the electronic component.

20. The loading device according to claim 17, wherein the recess comprises tapered edges, wherein the tapered edges guide the electronic component into the recess when the alignment device couples with the loader head.

21. A system for or loading a semi-conductor component into a socket, the system comprising:
    a socket comprising a moveable cover;
    a semi-conductor component disposed on a tray and directly underneath a loading machine, the loading machine comprising a device for aligning the loading machine in relation to the socket, wherein the loading machine comprises a mechanism for opening the moveable cover while loading the semi-conductor component into the socket; and a precision alignment device comprising a recess and aligning features, wherein the recess positions the semi-conductor component on the loading machine when lowering a bottom surface of the loading machine in direction of the precision alignment device and releasing a vacuum on the bottom surface of the loading machine, and wherein the precision alignment device, the socket and the tray are separate and distinct units.

* * * * *